United States Patent
Kozlov et al.

(10) Patent No.: US 9,791,525 B2
(45) Date of Patent: Oct. 17, 2017

(54) METHODS OF PREPARING AND OPERATING AN MRI MULTI-CHANNEL COIL

(75) Inventors: Mikhail Kozlov, Dresden (DE); Robert Turner, Leipzig (DE)

(73) Assignee: Max-Planck-Gesellschaft zur Förderung der Wissenschaften e.V. (DE)

( * ) Notice: Subject to any disclaimer, the term of this patent is extended or adjusted under 35 U.S.C. 154(b) by 813 days.

(21) Appl. No.: 14/235,475

(22) PCT Filed: Aug. 1, 2011

(86) PCT No.: PCT/EP2011/003852
§ 371 (c)(1),
(2), (4) Date: Feb. 10, 2014

(87) PCT Pub. No.: WO2013/017139
PCT Pub. Date: Feb. 7, 2013

(65) Prior Publication Data
US 2014/0152309 A1 Jun. 5, 2014

(51) Int. Cl.
*G01V 3/00* (2006.01)
*G01R 33/36* (2006.01)
(Continued)

(52) U.S. Cl.
CPC ......... *G01R 33/36* (2013.01); *G01R 33/3415* (2013.01); *G01R 33/5612* (2013.01); *G01R 33/365* (2013.01); *G01R 33/5659* (2013.01)

(58) Field of Classification Search
CPC .............. G01R 33/543; G01R 33/3607; G01R 33/5612; G01R 33/5659; G01R 33/583
(Continued)

(56) References Cited

U.S. PATENT DOCUMENTS

| 5,351,688 A | * | 10/1994 | Jones | G01R 33/34046 324/318 |
| 5,861,749 A | * | 1/1999 | Van Heelsbergen | G01R 33/3415 324/318 |

(Continued)

FOREIGN PATENT DOCUMENTS

| DE | 2011029452 | * | 3/2011 |
| WO | 2010/110881 A1 | | 9/2010 |
| WO | 2011/029452 A1 | | 3/2011 |

OTHER PUBLICATIONS (Kozlov) WO2011/029452 A1, publication date: Mar. 17, 2011.*
(Continued)

*Primary Examiner* — Walter L Lindsay, Jr.
*Assistant Examiner* — Frederick Wenderoth
(74) *Attorney, Agent, or Firm* — DLA Piper LLP (US)

(57) ABSTRACT

A method of preparing a multi-channel coil, in particular for magnetic resonance imaging (MRI) or for a medical treatment device, wherein the multi-channel coil comprises at least two coil rows being axially arranged along a longitudinal direction (z), wherein each of the at least two coil rows comprises a plurality of coil elements being azimuthally distributed relative to the longitudinal direction (z), comprises the steps of a) electro-magnetic decoupling of the coil rows relative to each other, and b) minimizing a reflected power ($P_{ref\_row}$) individually of each of the coil rows. Furthermore, a method of operating a multi-channel coil, in particular for magnetic resonance imaging (MRI) or for a medical treatment device, and a multi-channel coil, which is prepared using to the above method are described.

14 Claims, 4 Drawing Sheets

(51) Int. Cl.
G01R 33/3415 (2006.01)
G01R 33/561 (2006.01)
G01R 33/565 (2006.01)

(58) Field of Classification Search
USPC .......................................................... 324/314
See application file for complete search history.

(56) References Cited

U.S. PATENT DOCUMENTS

| | | | | |
|---|---|---|---|---|
| 6,164,241 | A * | 12/2000 | Chen ..................... | H01J 37/321 |
| 7,449,888 | B1 * | 11/2008 | Malik .............. | G01R 33/34046 |
| | | | | 324/318 |
| 7,525,313 | B2 * | 4/2009 | Boskamp ........... | G01R 33/3415 |
| | | | | 324/309 |
| 2002/0169374 | A1 * | 11/2002 | Jevtic ................... | G01R 33/365 |
| | | | | 600/422 |
| 2006/0006870 | A1 * | 1/2006 | Wang ................... | G01R 33/365 |
| | | | | 324/322 |
| 2011/0084694 | A1 * | 4/2011 | Waffenschmidt .... | G01R 33/283 |
| | | | | 324/318 |

OTHER PUBLICATIONS

Kyle M. Gilbert, et al., "A radiofrequency coil to facilitate $B_1^+$ shimming and parallel imaging acceleration in three dimensions at 7 T," NMR in Biomedicine, vol. 24, No. 7, Dec. 8, 2010 (Dec. 8, 2010), pp. 815-823.

G. C. Wiggins, et al., "A Close-Fitting 7 Tesla 8 Channel Transmit/Receive Helmet Array with Dodecahedral Symmetry and B1 Variation Along Z," Proceedings of the International Society for Magnetic Resonance in Medicine, 16th Scientific Meeting and Exhibition, Toronto, Canada, May 3-9, 2008, Apr. 19, 2008 (Apr. 19, 2008), p. 148.

Hoby P. Hetherington, et al., "RF Shimming for Spectroscopic Localization in the Human Brain at 7 T," Magn. Reson. Med., vol. 63, 2010, pp. 9-19.

Ulrich Katscher, et al., "Transmit SENSE," Magn. Reson. Med., vol. 49, 2003, pp. 144-150.

G. Adriany, et al., "Experimental verification of enhanced B1 Shim performance with a Z-encoding RF coil array at 7 tesla.," Proceedings of the 18th Annual Meeting May 2010, p. 3831.

N. I. Avdievich, et al., "Improved Longitudinal Coverage for Human Brain at 7T: A 16 Element Transceiver Army," Proceedings of the 19th Annual Meeting of ISMRM May 2011, p. 328.

N. I. Avdievich, et al., "Short Echo Spectroscopic Imaging of the Human Brain at 7T Using Transceiver Arrays," Magn. Reson. Med., vol. 62, 2009, pp. 17-25.

Mikhail Kozlov, et al., "Fast MRI coil analysis based on 3-D electromagnetic and RF circuit co-simulation," Journal of Magnetic Resonance, vol. 200, 2009, pp. 147-152.

* cited by examiner

METHODS OF PREPARING AND OPERATING AN MRI MULTI-CHANNEL COIL

TECHNICAL FIELD

The present disclosure relates to a method of preparing a multi-channel coil, in particular for magnetic resonance imaging (MRI) or for a medical treatment device, wherein performance and homogeneity of multi-channel (multi-input, multi-element) near-field radio frequency (RF) coils can be improved. Furthermore, the present disclosure relates to a method of operating the multi-channel coil, in particular to a method of controlling the multi-channel coil for generating and/or sensing RF magnetic fields. Furthermore, the present disclosure relates to a multi-channel coil prepared for magnetic resonance imaging or included in a medical treatment device. Applications of the disclosure are in the fields of designing and on-site usage coils (antennas) for creating and/or sensing magnetic fields, in particular for magnetic resonance (MR) applications.

BACKGROUND

In the present specification, reference is made to the following publications illustrating prior art of conventional multi-channel coils for magnetic resonance (MR) applications, which are incorporated by reference in their entirety herein:

[1] H. Hetherington, N. Avdievich, A. Kuznetsov, and J. Pan: "RF Shimming for Spectroscopic Localization in the Human Brain at 7 T" in "Magn. Reson. Med." 63:9-19 (2010);
[2] U. Katscher, P. Bornert, C. Leussler, J. S. van den Brink: "Transmit SENSE" in "Magn. Reson. Med." 2003; 49: 144-150;
[3] G. Adriany, J. Ritter, T. Vaughan, K. Ugurbil, P.-F. Van de Moortele: "Experimental Verification of Enhanced B1 Shim Performance with a Z-Encoding RF Coil Array at 7 Tesla" in "Proceedings of the 18th Annual Meeting" 2010, p. 3831, May 2010;
[4] K. M. Gilbert, A. T. Curtis, J. S. Gati, L. M. Klassen, R. S. Menon: "A radiofrequency coil to facilitate B(1) (+) shimming and parallel imaging acceleration in three dimensions at 7 T" in "NMR Biomed" Dec. 8, 2010 [Epub ahead of print];
[5] G. C. Wiggins, A. Mareyam, K. Setsompop, V. Alagappan, A. Potthast, L. L. Wald: "A close-fitting 7 Tesla 8 channel transmit/receive helmet array with dodecahedral symmetry and B1 variation along" in "Proceedings of the 16th Annual Meeting of ISMRM" Toronto, Canada, p. 148, May 2008; and
[6] N. Avdievich, J. Pan, and H. Hetherington: "Improved longitudinal coverage for human brain at 7 T: A 16 Element Transceiver Array" in "Proceedings of the 19th Annual Meeting of ISMRM" Montreal, Canada, p. 328, May 2011;
[7] WO 2011/029452; and
[8] N. I. Avdievich, J. W. Pan, J. M. Baehring, D. D. Spencer and H. P. Hetherington: "Short Echo Spectroscopic Imaging of the Human Brain at 7 T Using Transceiver Arrays" in "Magn. Reson. Med." 62:17-25 (2009).

For magnetic resonance imaging, especially at high level of a static magnetic field (oriented in an axial direction), use of a multi-channel transmit coil for producing the desired RF field becomes increasingly important, because such a coil provides additional degrees of freedom that enable static RF shimming (adjustment of amplitude and phase of excitation signals to obtain better homogeneity).

The coil can be excited: 1) by a single-channel transmit power source connected to multi-channel power splitter followed by a phase shifter, such that the relationship between RF amplitude and phase for each channel remains the same for any slice excitation; or 2) by a multi-channel power transmitter unit, with which the homogeneity of each slice can be further improved (on a slice-by-slice basis) by using different RF shim settings for each slice excited [1].

It has been shown in practice that when the electromagnetic field wavelength is comparable with the dimensions of the volume of interest (VOI) (for instance, a human head at a static magnetic field of 7 T and above, thus a Larmor frequency of more than 300 MHz), a single row of coil elements placed around the azimuth of a cylindrical coil former cannot produce a highly uniform RF field within the entire VOI, no matter how the individual coils are driven using the RF shim principle. With such a coil geometry and slice-by-slice optimization, it is possible to achieve reasonable RF homogeneity within transverse slices, but this cannot be achieved with coronal or sagittal slices.

Use of transmit SENSE [2] (dynamic RF shimming—simultaneous and time dependent adjustment of amplitude/phase of excitation signals and scanner gradient field) has been proposed to improve homogeneity in any given slice. This approach allows very high homogeneity to be obtained for any slice within the VOI, at the expense of the need to repeat the laborious preparation procedure for each subject (and even each position of a given subject within a coil).

The preparation procedures both for static and dynamic RF shimming include the rather time consuming step of RF field mapping (for all slices excited), followed by 1) calculation/optimization of required RF shim sets for static RF shim; and 2) optimization of the RF pulse sequence (amplitude and phase at each excitation time step) for each individual transmit channel and scanner gradient sequence for RF dynamic shim. In most cases, the results (the RF shim sets or RF pulse sequence) obtained are dependent on the coil loading, in particular varying with human subject. In general, static and dynamic RF shimming requires correct coil tuning, matching and decoupling, which are also, in most cases, load dependent.

The maximum value within the load of the local specific absorption rate (SAR) and the global SAR significantly depends on the specific combination of RF amplitudes and phases of individual transmit channels. For this reason, use of either static or dynamic RF shimming requires a reliable real-time SAR monitoring system. The hardware infrastructure required for this is absent from present-day commercially available MRI scanners, resulting in their sub-optimal usage, especially for clinical applications, in which the allowed SAR values are much smaller than strictly required for patient safety.

Because implementation of static RF shimming is much less complicated than dynamic RF shimming, the strategy has been proposed of using multiple rows of coils to improve the RF homogeneity in the axial direction while using only static RF shimming [3, 4, 5, 6]. These studies have shown that this indeed improves useful axial coverage, but results in additional complexity in coil design and fabrication, because all elements must be separately adjusted and matched, as well as decoupled from all adjacent elements.

The most common RF coil tuning, matching and decoupling procedure is the minimization of each element's reflection coefficient ($S_{xx}$) and its coupling ($S_{xy}$) with adjacent elements. This usually entails that all $S_{xx}$ and $S_{xy}$ values approach their minimum at a frequency equal to the MRI Larmor frequency ($f_{res}$). This condition is relatively easy to achieve for coils with a moderate number of elements, but for a multi-row array, in which there are at least four adjacent elements (depending on the specific spatial design), the full procedure is challenging and lengthy [4].

If after tuning, matching and decoupling the $S_{xy}$ values are not small enough, the power reflected by the entire coil ($P_{ref\_coil}$) can amount to a substantial fraction of the entire transmit power ($P_{transmit}$). This can result in severe degradation of the coil performance estimated as $B_1+_{VOI}/\sqrt{P_{transmit}}$, where $B_1+_{VOI}$ is $B_1+$ averaged over the VOI.

Direct minimization of the total reflected power $P_{ref\_coil}$, with the omission of any dedicated decoupling network, has been shown to provide a simple method for achieving the maximum near-field magnetic field generated per unit delivered power, for most single-row closed loop multi-channel coils, independently of the design of the array radiative elements (loop, shielded microstrip, stripline). However, this approach fails for the multi-row array. While the method easily handles the coupling between azimuthally adjacent coil elements (and in most cases benefits from it), there are no degrees of freedom available to compensate for axial coupling.

SUMMARY

According to a first aspect of the disclosure, a method of preparing a multi-channel coil, in particular for magnetic resonance imaging (MRI) or for a medical treatment device, is provided, wherein the multi-channel coil comprises at least two coil rows (or: coil rings) being axially arranged along a longitudinal direction and wherein each of the at least two coil rows comprises a plurality of coil elements being azimuthally distributed relative to the longitudinal direction. According to the disclosure, the coil preparing method comprises a step of electro-magnetic decoupling of the coil rows relative to each other. Furthermore, according to the disclosure, the coil preparing method comprises a step of minimizing a reflected power ($P_{ref\_ring}$) individually of each of the coil rows.

The term "preparing" refers to the design and/or fabrication of the multi-channel coil including the coil elements and their electrical coupling with each other and with a control and/or power device. In particular, the term "preparing" includes geometrical adjusting and/or electrical adjusting of the coil elements. The term "coil elements" refers to any components, which are capable of generating and/or sensing RF fields and which can be arranged along an azimuthal direction forming a coil row, like e.g. loops. Each of the coil elements provides one channel of the multi-channel coil. Within each coil row, coil elements with equal or different shapes can be arranged. The coil elements typically have a curved shape along the azimuthal direction and a curved or polygonal shape on a surface of the coil row. In particular, the term "coil elements" refers to coil loops of electrical conductors, like wires or strips.

Advantageously, the method allows the optimization of performance of the multi-row multi-channel near-field RF coil, the elements of which are arranged in at least two rows. The method improves RF power efficiency, RF homogeneity and load independence. In particular, as exemplary advantages, the inventive method requires much less effort for coil element decoupling, as compared with full decoupling of all adjacent elements, and it requires neither the B1+ mapping for each load needed to calculate static RF shim parameters, nor the calculation of RF and magnetic field gradient pulse profiles required for Transmit SENSE. The inventive method requires decoupling of adjacent rows and minimization of $P_{ref\_row}$ only once, because these conditions are stable over a wide range of loads (load independence). This contrasts with the prior art which entails decoupling, adjusting and matching of all adjacent elements for each load, a much more complex procedure because many more decoupling elements are required, and because adjusting and matching strongly depend on load. The conventional decoupling of adjacent elements within each row also depends both on the load and the adjusting/matching condition.

The simplicity obtained with the disclosure ensures much more stable coil operation and maintenance, and makes the $P_{ref\_row}$ guided optimization of efficiency, homogeneity and load independence of a multi-row multi-channel near-field RF coil suitable for real applications. The main MRI applications of the disclosure are in the field of medical imaging. It is important to provide the highest RF field homogeneity, in order to obtain fast and reliable MR images e.g. of a patient as well as load (subject) independence. This disclosure also allows fast and easy maintenance of coil hardware on-site.

According to a second aspect of the disclosure, a method of operating a multi-channel coil is provided, wherein the multi-channel coil is prepared according to the above first aspect of the disclosure and each coil element of the multi-channel coil is excited by radio-frequency power signals, wherein a phase shift is pairwise applied between the at least two coil rows. According to the disclosure, each row of coil elements, i.e. each ring-shaped arrangement of coil elements, is simultaneously excited with specific RF power signals of fixed amplitude and phase, e.g. RF power signals providing circular polarization modes. In this method, optimization of efficiency, homogeneity, and load independence is achieved by decoupling each row from all other rows, direct minimization of $P_{ref\_coil}$ at $f_{res}$ in each row, and applying a sequential phase shift (static shim) between each row. Advantageously, sub-steps of exciting, measuring and adjusting can be at least partially simulated by numerical methods.

According to a third aspect of the disclosure, a multi-channel coil is provided, which is prepared according to the above first aspect of the disclosure.

The step of electro-magnetic decoupling of the coil rows means arranging and/or adjusting the coil rows such that if RF power is applied to one of the coil rows, no or negligible RF power is reflected from this and any other of the coil rows. Electromagnetic coupling between the coil rows is cancelled. As an advantage of the disclosure, different methods are available for this arranging and/or adjusting the coil rows, which can be applied individually or in combination.

According to a first variant, the decoupling step includes adjusting an azimuthal configuration of coil elements of one of the coil rows in relation to coil elements of an adjacent coil row. The position of the coil elements of one of the coil rows along the azimuthal direction is adjusted relative to the position of the coil elements of the adjacent coil row, e.g. the coil rows are rotated relative to each other such that the coil elements have different azimuthal positions.

According to a second variant, the decoupling step includes adjusting an overlapping of the coil rows relative to the longitudinal direction of the multi-channel coil. An overlapping configuration of the coil elements of one of the coil rows in relation to coil elements of the adjacent coil row is provided.

According to a third variant, the decoupling step includes an inductive decoupling. In particular, at least one decoupling inductive loop, in particular at least one inductor of an inductor based decoupling network, is adjusted, wherein the inductor based decoupling network is connected between at least two of the coil rows.

According to a fourth variant, the decoupling step includes a capacitive decoupling, wherein at least one decoupling capacitor of a capacitor based decoupling network is adjusted. The at least one capacitor based decoupling network is connected between at least two of the coil rows.

The step of minimizing a reflected power of each of the coil rows includes individual electrical adjusting of the coil elements of each of the coil rows such that if RF power is applied to each of the coil rows, minimum RF power is reflected from the respective coil row. The electrical adjusting is obtained from numerical simulations and/or experimental tests, optionally in an iterative fashion. Again, different inductive and/or capacitive methods are available for this adjusting of the coil elements, which can be applied individually or in combination. Thus, according to a first variant, the minimizing step includes adjusting at least one reflectance minimizing capacitor based network, including a single capacitor or multiple capacitors, included in at least one coil element of at least one of the coil rows or between at least two coil elements of at least one of the coil rows. According to further variants, the minimizing step includes adjusting at least one capacitor and/or inductor based feed network arranged for supplying RF power to at least one of the coil rows and/or adjusting at least one reflectance minimizing inductor based network, including a single inductor or multiple inductors, included in at least one coil element of at least one of the coil rows.

According to an illustrative embodiment of the disclosure, the adjusting step is conducted by measuring a reflected power ($P_{ref\_row}$) and adjusting the reflectance minimizing capacitor based networks, the at least one capacitor and/or inductor based feed network and/or the reflectance minimizing inductor based networks such that the reflected power ($P_{ref\_row}$) is minimized individually for each of the coil rows. Alternatively or additionally, a scattering matrix (S matrix) can be measured of each of the coil rows using a network analyzer device. The reflected power ($P_{ref\_row}$) is calculated from the S matrix and excitation vector and the reflectance minimizing capacitor based networks, at least one capacitor and/or inductor based feed network and/or the reflectance minimizing inductor based networks are adjusted such that the reflected power ($P_{ref\_row}$) is minimized individually for each of the coil rows.

According to another illustrative embodiment of the disclosure, the decoupling and minimizing steps are iteratively conducted in an alternating manner at least two times, in particular at least three times. Thus, the decoupling of the coil rows and the minimization of the reflected power can be further improved.

Basically, the disclosure provides a method for load (subject) independence of coil transmit properties. Due to the minimized reflectance of each of the coil rows, coupling of the coil elements within one coil row is improved, so that the RF energy is equally distributed along the coil row. For obtaining this advantage, it may be preferred, that the decoupling and minimizing steps are conducted using a phantom load or a biological object load surrounded by the multi-channel coil, wherein the phantom or biological object load simulates conditions of real usage of the multi-channel coil. Accordingly, the minimized reflectance of each of the coil rows is obtained with conditions similar to the real conditions of use.

According to another illustrative embodiment of the disclosure, the multi-channel coil is a transmit coil of a magnetic resonance imaging device, e.g. a MR scanner. Alternatively, the multi-channel coil is a part of a medical treatment device, particularly a thermotherapeutic treatment device. Each coil row is simultaneously excited with a specific RF power signal of fixed amplitude and phase, which is selected for RF shimming. If the multi-channel coil comprises two coil rows, the phase shift for RF shimming is selected in the range from +70° to +120°. Analysis of simulation data shows that a phase shift (static shim) in particular in the range of +80° to +100° provides highly significant improvement (in most cases two-fold) of $B_1+$ homogeneity for both for entire VOIs, and for transverse, coronal, and sagittal slices. If the multi-channel coil comprises three coil rows, the phase shift is selected in the range from 20° to 80°, in particular from 30° to 60° between the second and the third rows.

Advantageously, different techniques of applying the RF power are available. As examples, a multi-channel transmit power source device, a single-channel transmit power source device connected with a multi-channel power splitter device and a phase shifter device, or a single-channel transmit power source device connected with a switching device and a phase shifter device can be used.

It is an exemplary aspect of the disclosure to provide an improved method of preparing a multi-channel coil, in particular for magnetic resonance imaging or for a medical treatment device, wherein restrictions and disadvantages of conventional techniques are reduced or avoided. Furthermore, an exemplary aspect of the disclosure is to provide an improved multi-channel coil and an improved method of operating the multi-channel coil.

BRIEF DESCRIPTION OF THE DRAWINGS

Further details and advantages of the disclosure are described in the following with reference to the attached drawings, which show in.

DETAILED DESCRIPTION

Exemplary embodiments of the disclosure are described in the following with exemplary reference to multi-channels coils 100 including two or three coil rows 10, 20 and 30 each with four or more coil elements 11, 12, 13, 14, 21, 22, 23, 24, 25, 26, 31, 32, 33 and 34. The number of coil elements per coil row is selected in particular in dependency on the operation frequency of the multi-channel coil 100. Each coil element should not be longer than the wavelength of the RF field. With a 7 T static magnetic field, at least four coil elements are provided per coil row, while with a 9.4 T static magnetic field at least six coil elements are provided per coil row. Thus, it is emphasized that the implementation of the disclosure is possible with multi-channels coils including more than three coil rows each with multiple coil elements.

Figure 1:
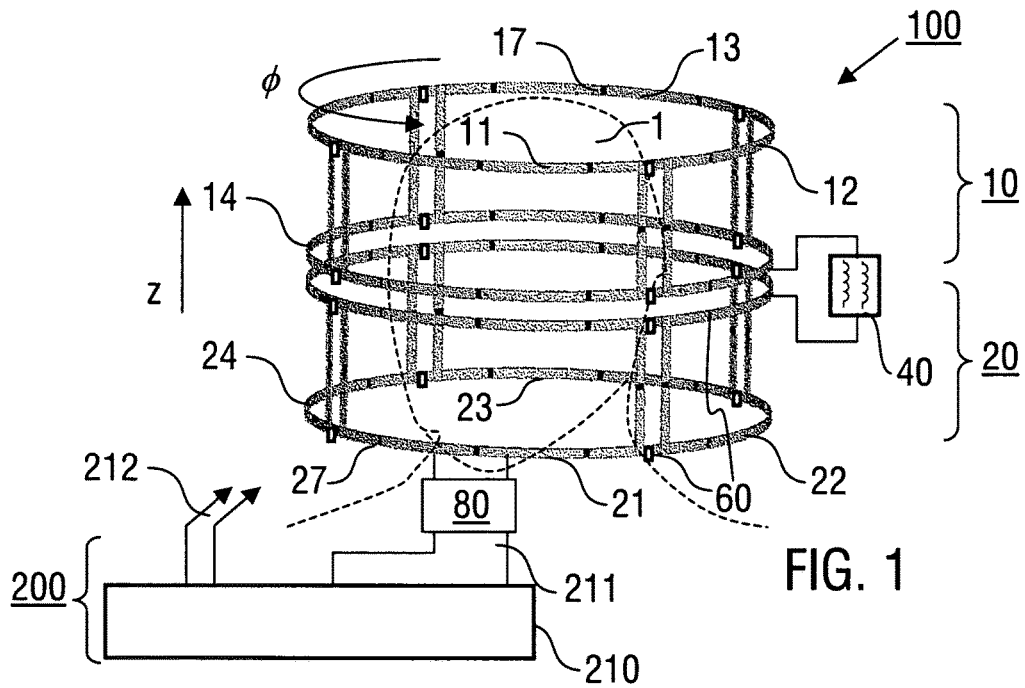
FIGS. 1 to 7 are schematic illustrations of multi-channel coils prepared and operated according to exemplary embodiments of the disclosed methods.

FIG. 1 illustrates a multi-channel coil 100 being prepared and excited according to a first embodiment of the disclosure. The multi-channel coil 100 comprises two coil rows 10, 20, which are arranged adjacent to each other along a longitudinal reference direction z. Each of the first and second coil rows 10, 20 comprises four loop-shaped coil elements 11, 12, 13, 14 and 21, 22, 23, 24, respectively. The coil elements of each coil row 10, 20 are serially arranged along an azimuthal reference direction φ. Each of the loop-shaped coil elements is made of an electrical conductor, like e.g. a conductor strip or a conductor wire, being interrupted with capacitances and/or inductors as outlined below.

For MRI applications, the multi-channel coil 100 is a transmit coil of an MRI device. The MRI device in particular includes the multi-channel coil 100 with the power source device 200, a magnetic field device for generating a static main field in z-direction and magnetic gradient devices as known from conventional MRI techniques (not shown). Alternatively, the multi-channel coil 100 can be provided as a magnetic field generator in a thermotherapeutic treatment device (not shown).

The coil elements 11-14 and 21-24 are arranged on a surface of a cylinder wherein the cylinder axis extends in the z-direction and the cylinder surface extends in the φ direction. In practice, the coil rows 10, 20 are supported by a hollow cylinder made of a dielectric material, e.g. a hollow acrylic cylinder. In the illustrated example, each coil row 10, 20 includes four coil elements with identical rectangular loops with a length of e.g. 70, 80 or 90 mm and an angular size of e.g. 85 or 75 degrees. The diameter of the coil rows 10, 20 is e.g. 25 or 28 cm.

The multi-channel coil 100 is connected with a power source device 200. In the illustrated example, the power source device 200 comprises a multi-channel transmit power source device 210, which supplies RF power to each coil element individually. In exemplary fashion, RF supply line 211 is illustrated including a capacitor based feed network 80 arranged for supplying RF power to the respective coil element 21 or to the whole coil row 20, wherein the RF supply line 211 connects e.g. the coil element 11 with the multi-channel transmit power source device 210. The capacitor based feed network 80 is e.g. designed as shown in [8]. Further RF supply lines with feed networks are provided for each of the remaining coil elements as schematically represented by the double arrow 212. The capacitor based feed network 80 can be replaced by an inductor based feed network or a capacitor and inductor based feed network.

FIG. 1 schematically illustrates an inductor based decoupling network 40, which is connected between the coil elements 12, 22 of the first and second coil rows 10, 20, respectively. The inductors of the inductor based decoupling network 40 are connected in series with the coil elements 12 and 22 as is it known from e.g. [8]. FIG. 1 illustrates one inductor based decoupling network 40 for exemplary purposes only. In practice, multiple networks can be provided. If more than two coil rows are provided (see e.g. FIG. 7), the coil rows are connected pairwise via inductor based decoupling networks.

The at least one inductor based decoupling network 40 is used for implementing the inventive decoupling step. Alternatively or additionally, other measures can be provided for implementing the decoupling step, like e.g. a provision of at least one capacitor based decoupling network (see FIG. 2), an azimuthal geometrical adjustment (see FIG. 2) and/or a longitudinal geometrical adjustment (see FIG. 3).

Each of the coil rows 11-14 and 21-24 includes multiple lump elements 17, 27 (illustrated as small black patches). The lump elements 17, 27 comprise capacitors, which are adapted for preventing a self-resonance of individual loops. The capacitors are selected as it is known from conventional RF techniques. Additionally, the capacitors can be used for minimizing reflectance, see e.g. capacitor 60 included in coil element 22.

The coil elements 11-14 and 21-24 are connected pairwise via reflectance minimizing capacitor based networks 60, which are variable capacitors used for minimizing the reflections of each of the coil rows 10, 20. Alternatively, the coil elements operate individually. In this case there are dielectric gaps on the place of capacitor based networks 60. Preferably, two reflectance minimizing capacitors 60 are provided between two of the coil elements, resp. The capacitors of the capacitor based networks 60 have a capacity in the range of e.g. 1 pF to 10 pF. They can be adjusted for the inventive preparing of the multi-channel coil 100.

According to an illustrative example, the multi-channel coil 100 is prepared according to the following steps. Firstly, if the multi-channel coil 100 is not yet fabricated, the size of the multi-channel coil 100 is selected in dependency on the particular imaging or treatment requirements. The wavelength of the RF field inside the object 1 should be comparable or less than the size of the object 1, e.g. a head of a patient. Furthermore, the longitudinal extension and diameter of the multi-channel coil 100 is to be selected such that the object 1 is covered. In particular, depending on the size of the object 1, two (e.g. FIG. 1) or three (e.g. FIG. 7) or even more coil rows are provided. For MRI applications using a 7 or 9.4 T static magnetic field, the multi-channel coil 100 is adapted for an RF frequency of 300 MHz or 400 MHz for investigating medium-sized objects with a wavelength of 12 cm or 8 cm, respectively. As another example, with a 3 T static magnetic field, larger objects can be imaged with a wavelength of about 30 cm corresponding to an RF frequency of about 125 MHz.

After fabricating the multi-channel coil 100, e.g. on a plastic cylinder, the decoupling and minimizing steps are implemented. Firstly, a decoupling of the coil rows 10, 20 is obtained by adjusting the inductor based decoupling network 40 or another decoupling network. In a first iterative step, this can be done by a numerical simulation. The inductor based decoupling network 40 is adjusted such that the simulated RF properties of the coil rows 10, 20 do not couple with each other. Decoupling of axially adjacent coil rows can be achieved by any suitable design approach.

Than, the reflectance minimizing capacitor based networks 60 and/or the capacitor and/or inductor based feed network 80 are adjusted, again as a result of a numerical simulation or with a measurement. In particular, minimization of $P_{ref\_coil}$ at $f_{res}$ for the entire coil is achieved by minimizing the power reflected by each row ($P_{ref\_row}$), by methods similar to the approach described in patent application [7], or alternatively by the direct connection of the coil (or each row) to a network analyzer and measurement of the entire S parameter matrix for each row ($S_{row}$), followed by the calculation $$P_{ref\_row} = a^H \cdot S_{row}^H \cdot S_{row} \cdot a,$$

where a denotes the complex excitation vector and the symbol "$H$" denotes the complex conjugate transpose. The sum of $P_{ref\_row}$ over all rows is $P_{ref\_coil}$, so that minimizing each $P_{ref\_row}$ results in minimization of $P_{ref\_coil}$. The inventive step utilizes the fact that $P_{ref\_row}$ depends on the values of the adjustable and replaceable coil components (including the components of the decoupling circuits). By changing these values, $P_{ref\_row}$ can be straightforwardly minimized. Because all rows are decoupled, application of the specified phase shift does not affect $P_{ref\_row}$ and $P_{ref\_coil}$.

Subsequently, the decoupling and minimizing steps are repeated for a final adjustment. If the decoupling and minimizing steps cannot be performed on-site due to safety issues, the coil performance can be pre-optimized once during fabrication stage, taking in account the expected loading conditions.

As the preferred application of the disclosure, optimization of the MRI multi-row multi-channel coil efficiency and homogeneity is guided by the minimization of the power reflected by each individual row and the power reflected by the entire coil, under conditions of real operational usage of the coil e.g. for MRI. Advantageously, the disclosed method is insensitive to the load dependence of the coil's efficiency and homogeneity.

After the preparation, the multi-channel coil 100 can be used e.g. in an MRI scanner. Each coil element of the multi-channel coil 100 is excited by radio-frequency power signals, wherein a phase shift is pairwise applied between the two coil rows 10, 20. In the case of two rows, application of a phase shift (static shim), in the range of about +80° to +100°, to the second row 20 (relative to first row 10) significantly increases the homogeneity inside the VOI, when an axially asymmetric load is excited, such as a human head.

Figure 2:
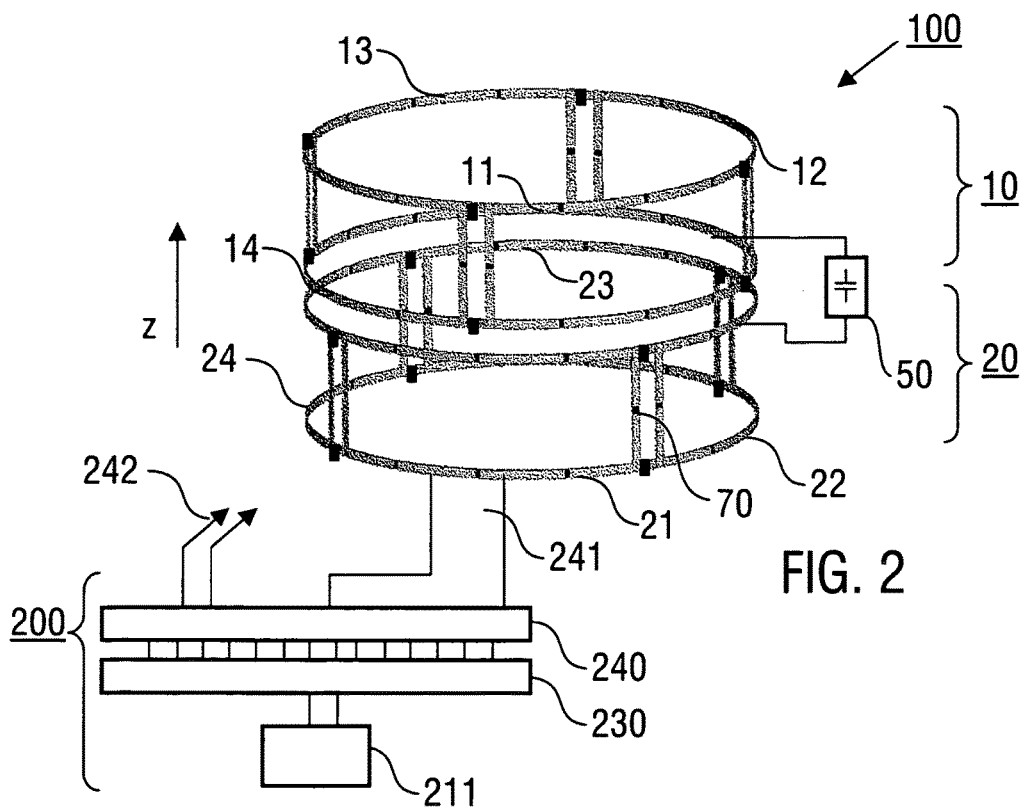

FIG. 2 illustrates another example of the disclosure wherein a multi-channel coil 100 with coil rows 10, 20 is used. Each of the coil rows 10, 20 is structured as described above with reference to FIG. 1. However, the azimuthal configuration of the coil elements 11-14 and 21-24 of the coil rows 10, 20 relative to each other is changed for a geometrical decoupling of the coil rows 10, 20. The coil rows 10, 20 are rotated around the axis of symmetry (z direction) of the multi-channel coil 100. The degree of rotation, e.g. 45°, is selected for obtaining the geometrical decoupling of the coil rows 10, 20.

Furthermore, FIG. 2 illustrates a capacitor based decoupling network 50, which is connected between the coil rows 10, 20. Decoupling can be obtained by the effect of both of rotating the coil rows 10, 20 relative to each other and the adjustment of the capacitor of the capacitor based decoupling network 50. The capacitors of the based decoupling network 50 have a capacity of e.g. 1 pF to 20 pF.

As a further modification compared with FIG. 1, reflectance minimizing inductor based networks 70 are shown as being included in at least one coil element 11, 12, . . . , 21, 22, . . . , of at least one of the coil rows. The reflectance minimizing inductor based networks 70 can be adjusted as mentioned above with reference to the reflectance minimizing capacitors 60. As an example, the reflectance minimizing inductor based networks 70 have an inductance in the range of 10 to 40 nH and mutual inductor coupling coefficient k in the range of −1.0 to 1.0.

FIG. 2 illustrates an alternative variant of the power source device 200. In the illustrated example, a single-channel transmit power source device 220 is provided, which is connected with a multi-channel power splitter device 230 and a phase shifter device 240. The phase shifter device 240 is connective via supply lines 241, 242 (including a capacitor based feed network, not shown) with each of the coil elements of the coil rows 10, 20.

The multiple-channel coil 100 of FIG. 2 is prepared and operated as outlined above. Additional to the adjustment of the decoupling capacitor 50, the decoupling step includes the adjustment of the azimuthal configuration of the coil rows 10, 20.

Figure 3:
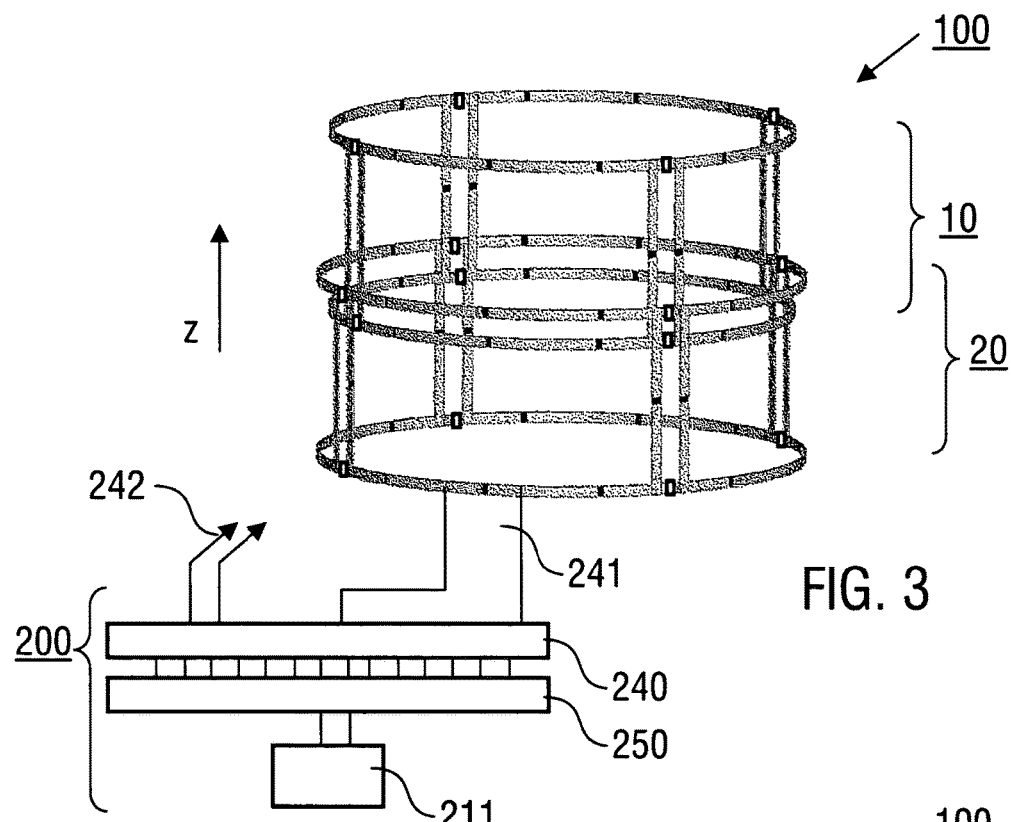
Figure 4:
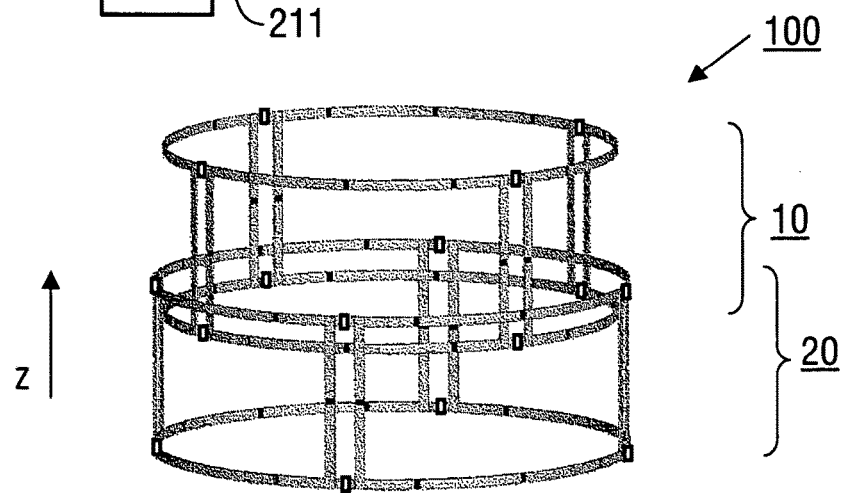

FIG. 3 shows another example of implementing the decoupling step with a multi-channel coil 100. With this example, two coil rows 10, 20 each with four coil elements are provided with an overlapping configuration along the longitudinal direction (z). The overlapping configuration can be fabricated by positioning one of the coil rows (e.g. 20) on an outer surface of the hollow cylinder carrying the multi-channel coil 100, while the other coil row (e.g. 10) is located on an inner surface of the cylinder. Alternatively, both coil rows 10, 20 can be fabricated on an outer surface of the carrying cylinder, while being separated by a dielectric layer.

Optionally, the decoupling of the coil rows 10, 20 by adjusting the overlapping configuration according to FIG. 3 can be combined with a decoupling using a inductive decoupling network as shown in FIG. 1 and/or a capacitor based decoupling network as shown in FIG. 2. Minimizing the reflectance of each of the coil rows 10, 20 can be obtained as described above.

FIG. 3 shows another example of the power source device 200, which comprises a single-channel transmit power source device 220, a switching device 250 and a phase shifter device 240. Again, each of the coil elements is connected with the phase shifter device 240 via supply lines 241, 242 (including a capacitor based feed network, not shown).

Figure 5:
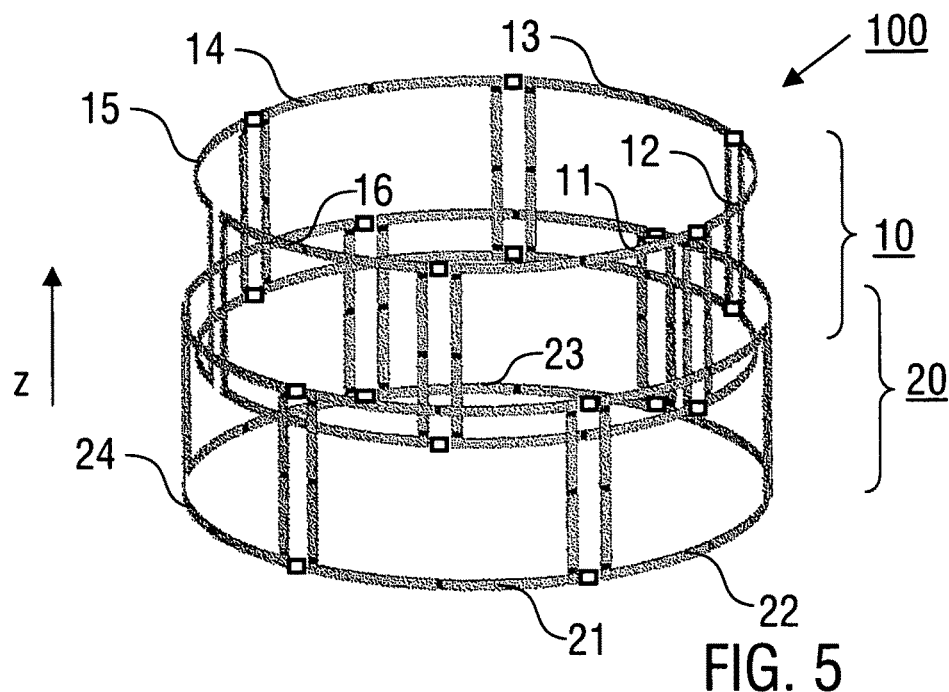
Figure 6:
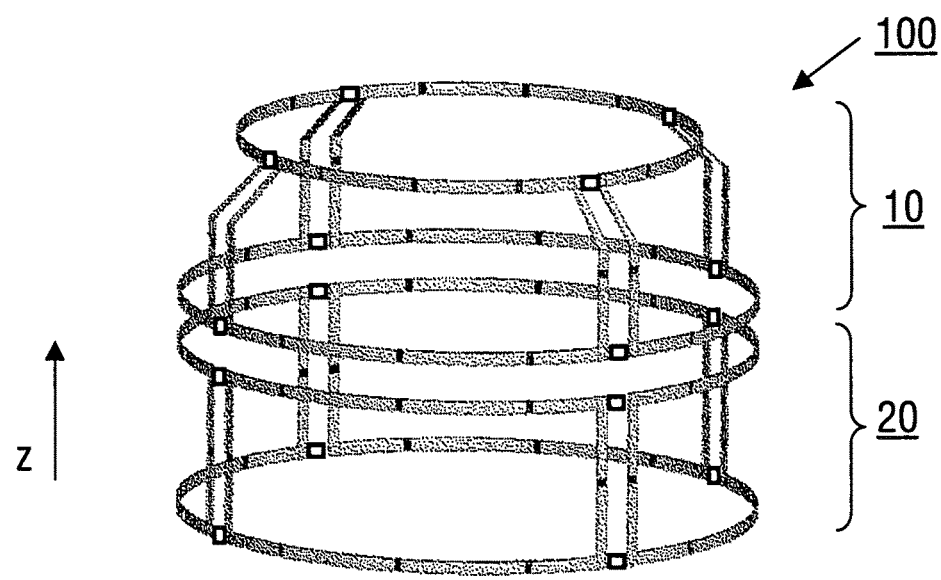
Figure 7:
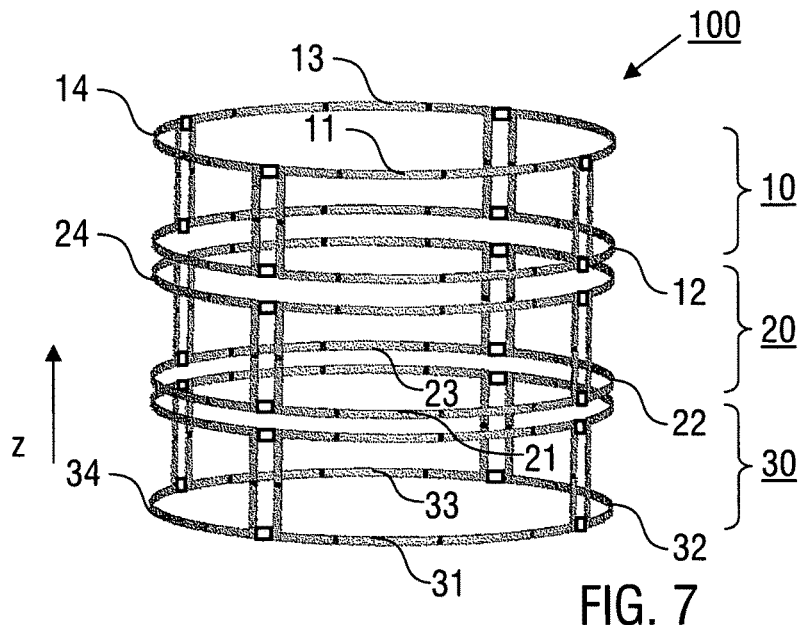

FIGS. 4 to 7 illustrate further variants of designing the multi-channel coil 100 for obtaining a predetermined decoupling of the coil rows 10, 20. According to FIG. 4, two coil rows 10, 20 each with four coil elements are provided in an overlapping configuration as in FIG. 3, but with a mutual rotation of the coil rows 10, 20 relative to each other as shown in FIG. 2. FIG. 5 illustrates that both coil rows 10, 20 may have different numbers of coil elements 11-16 and 21-24 as it may be preferred for high static magnetic fields, e.g. 9.4 T. FIG. 6 shows that the coil rows 10, 20 are not necessarily arranged on a cylinder surface. For an improved adaptation to the size and shape of the object to be investigated, at least one of the coil rows 10, 20 can be arranged on a cone-shaped surface as shown in FIG. 6 in an exemplary manner. Finally, FIG. 7 illustrates an example of a multi-channel coil including three coil rows 10, 20 and 30 each with four coil elements 11-14, 21-24 and 31-34, respectively. In the case of three rows, application of a phase shift (static shim), in the range from 70° to 120°, in particular from 80° to 100°, between the first (10) and the second rows (20), and in the range from 20° to 80°, in particular from 30° to 60° between the second (20) and the third (30) rows significantly increases the homogeneity inside the VOI, when an axially asymmetric load is excited, such as a human head.

Figure 8:
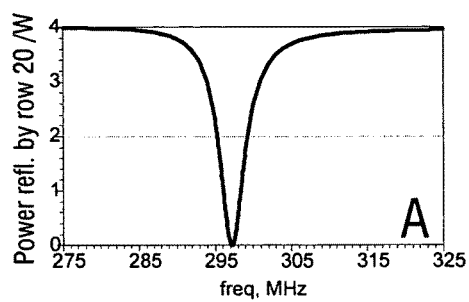
FIG. 8 shows graphical representations of experimental results obtained with multi-channels coils prepared and operated according to exemplary embodiments of the disclosure.
Figure 8:
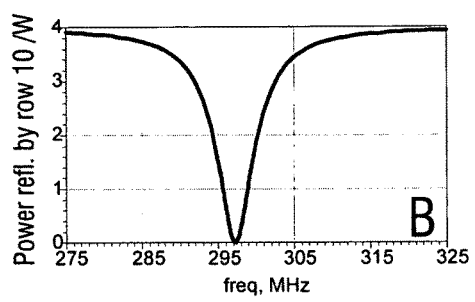
Figure 8:
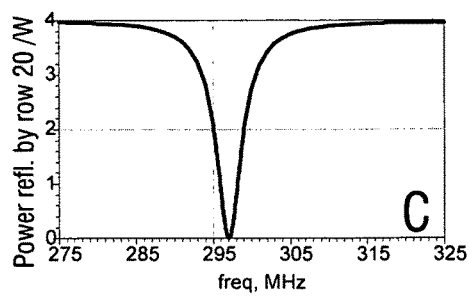
Figure 8:
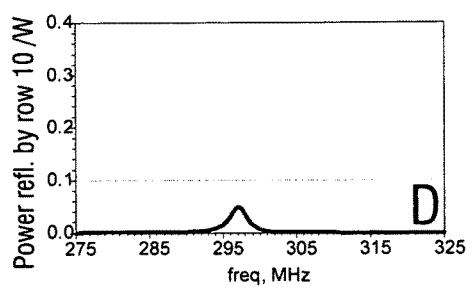

FIG. 8 illustrates experimental results obtained with the disclosure wherein a multi-channel coil 100 according to FIG. 1 has been prepared for investigating a human head. With a adjusting arrangement of "dual row array" according to FIG. 1 and simultaneous row excitation, FIG. 8A shows power reflected by the $2^{nd}$ row 20, and FIG. 8B shows power reflected by $1^{st}$ row 10. With a adjusting arrangement of the "dual row array" and only $2^{nd}$ row excitation, FIG. 8C shows power reflected by $2^{nd}$ row 20, FIG. 8D shows power reflected by $1^{st}$ row 10, which is in this case the measure of row coupling, which is suppressed to a degree such that it is negligible for an MRI application.

The features of the disclosure in the above description, the drawings and the claims can be of significance both individually as well in combination for the realisation of the disclosure in its various embodiments.

Such changes and modifications can be made without departing from the spirit and scope of the present disclosure and without diminishing its intended advantages. For example, any of the concepts and features described in connection with any example, embodiment or variation herein may also apply and be utilized in connection with any other example, embodiment or variation described herein alone or in combination. In addition, any of the concepts and features disclosed herein may be provided by appropriate hardware, software and/or combination of both hardware and software where desired and deemed appropriate. It is therefore intended that such changes and modifications be covered by the appended claims.

The invention claimed is:

1. A method of operating a multi-channel transmit coil for at least one of magnetic resonance imaging or a medical treatment device, wherein the multi-channel coil comprises two or three coil rows being axially arranged adjacent to each other along a longitudinal direction, wherein each of two or three coil rows comprises a plurality of coil elements being arranged in a ring such that they are azimuthally distributed around the longitudinal direction, wherein the multi-channel transmit coil has been prepared by:
electro-magnetic decoupling of the two or three coil rows relative to each other, and
minimizing a reflected power individually of each of the coil rows,
said method comprising the step of:
exciting each coil element of the multi-channel transmit coil by radio-frequency power signals,
wherein:
an excitation phase shift is pairwise applied between first and second rows of the two coil rows or between first, second and third rows of the three coil rows, and
the excitation phase shift being selected in a range from 70° to 120° between the first row and the second row of the two coil rows, or in a range from 70° to 120° between the first row and the second row and in a range from 20° to 80° between the second row and the third row of the three coil rows.

2. The method according to claim 1, wherein the step of electro-magnetic decoupling includes at least one of:
adjusting an azimuthal configuration of coil elements of one of the coil rows in relation to coil elements of an adjacent coil row,
adjusting an overlapping configuration of coil elements of one of the coil rows in relation to coil elements of an adjacent coil row, the overlapping configuration being adjusted relative to the longitudinal direction,
adjusting at least one inductor of an inductor based decoupling network connected between at least two of the coil rows, and
adjusting at least one capacitor of a capacitor based decoupling network connected between at least two of the coil rows.

3. The method according to claim 1, wherein the minimizing step includes at least one of:
adjusting at least one reflectance minimizing capacitor based network included in at least one coil element of at least one of the coil rows,
adjusting at least one reflectance minimizing capacitor based network arranged between at least two coil elements of at least one of the coil rows,
adjusting at least one of at least one capacitor and at least one inductor based feed network arranged for supplying RF power to at least one of the coil rows, and
adjusting at least one reflectance minimizing inductor based network included in at least one coil element of at least one of the coil rows.

4. The method according to claim 3, wherein the adjusting step includes at least one of:
measuring the reflected power and adjusting at least one of the reflectance minimizing capacitor based networks, the reflectance minimizing inductor based networks and the at least one of capacitor and inductor based feed network such that the reflected power is minimized individually for each of the coil rows, and
measuring a scattering matrix of each of the coil rows using a network analyzer device, calculating the reflected power from the scattering matrix and adjusting at least one of the reflectance minimizing capacitor based networks, the reflectance minimizing inductor based networks and the at least one of the capacitor and inductor based feed networks such that the reflected power is minimized individually for each of the coil rows.

5. The method according to claim 1, wherein the decoupling and minimizing steps are iteratively conducted in an alternating manner.

6. The method according to claim 1, wherein:
the decoupling and minimizing steps are conducted using a phantom load or a biological object load surrounded by the multi-channel coil, and
the phantom or biological object load simulates conditions of real usage of the multi-channel coil.

7. The method according to claim 1, wherein the medical treatment device is a thermotherapeutic treatment device.

8. The method according to claim 1, being adapted for magnetic resonance imaging or for a medical treatment device.

9. The method according to claim 1, wherein the multi-channel coil comprises two coil rows and the phase shift is selected in the range from 80° to 100°.

10. The method according to claim 1, wherein the phase shift is selected in the range from 80° to 100° between the first and the second rows.

11. The method according to claim 1, wherein the phase shift is selected in the range from 30° to 60° between the second and the third rows.

12. The method according to claim 1, wherein the radio-frequency power is applied with a power source device comprising at least one of:
a multi-channel transmit power source device,
a single-channel transmit power source device connected with a multi-channel power splitter device and a phase shifter device, and
a single-channel transmit power source device connected with a switching device and a phase shifter device.

13. The method according to claim 1, wherein the steps of exciting, measuring and adjusting are at least partially simulated.

14. A multi-channel transmit coil, which is prepared using the method according to claim 1.

* * * * *